United States Patent
Ramesh et al.

(10) Patent No.: US 10,095,813 B2
(45) Date of Patent: Oct. 9, 2018

(54) SAFETY ANALYSIS OF A COMPLEX SYSTEM USING COMPONENT-ORIENTED FAULT TREES

(71) Applicant: The Boeing Company, Seal Beach, CA (US)

(72) Inventors: Anapathur V. Ramesh, Bothell, WA (US); David W. Twigg, Federal Way, WA (US)

(73) Assignee: THE BOEING COMPANY, Chicago, IL (US)

( * ) Notice: Subject to any disclaimer, the term of this patent is extended or adjusted under 35 U.S.C. 154(b) by 1057 days.

(21) Appl. No.: 14/082,506

(22) Filed: Nov. 18, 2013

(65) Prior Publication Data
US 2015/0142402 A1   May 21, 2015

(51) Int. Cl.
*G06F 17/50* (2006.01)
*G05B 23/02* (2006.01)

(52) U.S. Cl.
CPC ..... *G06F 17/5009* (2013.01); *G05B 23/0248* (2013.01); *Y02T 10/82* (2013.01)

(58) Field of Classification Search
CPC combination set(s) only.
See application file for complete search history.

(56) References Cited

U.S. PATENT DOCUMENTS

| | | |
|---|---|---|
| 7,158,958 B2 | 1/2007 | Przytula et al. |
| 7,770,052 B2 | 8/2010 | King et al. |
| 8,015,550 B2 * | 9/2011 | Berenbach .......... G06F 11/2257 714/25 |
| 8,121,042 B2 | 2/2012 | Wang et al. |
| 8,346,694 B2 * | 1/2013 | Dugan ............... G06Q 10/0635 706/45 |
| 2009/0265119 A1 * | 10/2009 | Bhattacharya ......... G06Q 10/06 702/34 |

(Continued)

OTHER PUBLICATIONS

Kaiser, Bernhard, Catharina Gramlich, and Marc Förster. "State/event fault trees—A safety analysis model for software-controlled systems." Reliability Engineering & System Safety 92, No. 11 (2007): 1521-1537.*

(Continued)

*Primary Examiner* — Aniss Chad
(74) *Attorney, Agent, or Firm* — Womble Bond Dickinson (US) LLP

(57) ABSTRACT

A safety-analysis system for a complex system such as an aircraft includes a system modeler and model-analysis system. The system modeler is configured to receive component fault-based models of respective components of which a system is composed, such as from a library of component fault-based models in storage. The component fault-based models include transfer functions expressed as fault trees each of which describes behavior of a respective component in an event of a failure of the respective component or of an input to the component. The system modeler is also configured to assemble the component fault-based models into a system fault-based model of the system, with the system fault-based model including a transfer function expressed as an assembly of the fault trees of the component fault-based models. The model-analysis system, then, is configured to perform a safety analysis using the system fault-based model.

20 Claims, 16 Drawing Sheets

(56) References Cited

U.S. PATENT DOCUMENTS

2010/0100251 A1* 4/2010 Chao ............... G05B 23/0245
　　　　　　　　　　　　　　　　　　　　　　　700/292
2012/0317058 A1* 12/2012 Abhulimen .......... G06N 99/005
　　　　　　　　　　　　　　　　　　　　　　　706/2

OTHER PUBLICATIONS

Canadian Examination Report dated Oct. 15, 2015 for Application No. 2,857,923.
Examination Report dated Aug. 12, 2016 for Application No. 2,857,923.
Lars Grunske et al., "Automatic Generation of Analyzable Failure Propagation Models from Component-Level Failure Annotations", Proceedings of the Fifth International Conference on Quality Software (QSIC 2005), Sep. 19, 2005.
Bernhard Kaiser et al., "A New Component Concept for Fault Trees", 8th Australian Workshop on Safety Critical Systems and Software (SCS 2003), Jan. 1, 2003.
Rasmus Adler et al., "Integration of Component Fault Trees in the UML", Models in Software Engineering: Workshops and Symposia at Models 2010; XP-002687340. 2011.
Lars Grunske et al., "An Automated Dependability Analysis Method for COTS-Based Systems", XP-055206465, Jan. 1, 2005, vol. 3412, pp. 178-190.
European Search Report for Application No. 14193624.5 dated Aug. 12, 2015.
Bieber et al., "Safety Assessment With AltaRica," IFIP International Federation for Information Processing, vol. 156, 2004, pp. 505-510.
Bozzano et al., "ESACS: an integrated methodology for design and safety analysis of complex systems," Copyright European Safety and Reliability 2003, 8 pages.
Bozzano et al., "Safety, Dependability and Performance Analysis of Extended AADL Models," Copyright 2010, The Computer Journal, vol. 54 No. 5, 2011, 22 pages.
Bozzano et al., "The FSAP/NuSMV-SA Safety Analysis Platform," Software Tools for Technology Transfer, 20 pages.
Bretschneider et al., "Model-based Safety Analysis of a Flap Control System," Managing Complexity and Change!, INCOSE 2004—14th Annual International Symposium Proceedings—11 pages.
"Considering Cumulative Effects Under the National Environmental Policy Act," Council on Environmental Quality Executive Office of the President, Jan. 1997, 61 pages.
"Failure mode and effects analysis," Copyright 2013, Wikipedia article—http://en.wikipedia.org/w/index.php?title=Failure_mode_and_effects_analysis&printable=yes, 6 pages.
"Fault tree analysis," 2013, Wikipedia article—http://en.wikipedia.org/wiki/Fault_tree[May 6, 2013 12:10:02 PM], 8 pages.
"Fault Tree Handbook with Aerospace Applications," NASA Office of Safety and Mission Assurance, Aug. 2002, 218 pages.
Joshi et al., "Model-Based Safety Analysis Final Report," 2006, 55 pages.
Joshi et al., "Model-Based Safety Analysis," Feb. 2006, NASA/CR-2006-213953—Prepared for Langley Research Center under Cooperative Agreement NCC-1-01001, 60 pages.
Merkling, "Seeking Failure-Free Systems," Air University Review, Jul.-Aug. 1976, 6 pages.
Mohr, "Failure Modes and Effects Analysis," Feb. 2002, 8th Edition, Jacobs Sverdrup, 37 pages.
Rauzy, "Model-Based Reliability Engineering: The AltaRica Language," (visited May 6, 2013) www.see.asso.fr/file/1643/download/5872, 24 pages.
European Examination Report dated Apr. 1, 2016 for Application No. 14 193 624.5.
Canadian Examination Report for Application No. 2,857,923 dated Jul. 11, 2017.

* cited by examiner

SAFETY ANALYSIS OF A COMPLEX SYSTEM USING COMPONENT-ORIENTED FAULT TREES

TECHNOLOGICAL FIELD

The present disclosure relates generally to safety analysis and, in particular, safety analysis of a complex system such as an aircraft using component-oriented fault trees.

BACKGROUND

A complex system such as an aircraft may be generally composed of a number of systems, and enable functionality greater than their individual systems. Technological advances in many complex systems including aircraft and others such as those in the aerospace, automotive, marine, medical and electronics industries have led to numerous mutually-dependent systems, at least some of which may be designed by different teams from different companies in different geographical locations. Analysis of failures or malfunctions of one or more of these systems is often required as part of a certification process. Typically such analyses are manually performed by groups of system analysts, without reference to a process capable of facilitating such analyses. As complex systems and the systems of which they are composed become more integrated, traditional analysis methods may no longer be practical in terms of breadth of coverage and labor costs involved.

There are a number of safety analysis practices in the aerospace industry. For example, fault tree analysis (FTA) is top-down analysis in which the causes of a failure effect are analyzed using deductive logic (e.g., Boolean logic) that combines contributing failures. Fault propagation modeling (FPM) is a process of developing a model (fault propagation model) that captures information about fault propagation across systems. Fault propagation models are often used in model-based safety analysis (MBSA), which is an emerging practice in which the system design and safety assessment processes develop a common model that is used to automatically generate a consistent set of safety artifacts.

Therefore, it may be desirable to have a system and method that improves upon existing practices.

BRIEF SUMMARY

Techniques such as MBSA that use fault propagation models are often used during design, development and certification of complex systems such as aircraft. Fault propagation models enable one to visualize failure propagation across components and systems, and thus validate or verify safety and reliability of a complex system. These models may also benefit the safety analyst and design engineers. The models may bring the failure model closer to the design engineers, and thus facilitate their understanding of the fault-tolerance and safety features of the complex system. Current tools for developing fault propagation models, however, are less than intuitive for end users, and often use computer-programming type languages.

One of the most widely used models to represent logic in safety analysis is the fault-tree model. Fault trees efficiently produce certification deliverables such as minimal cut sets and system failure probabilities. Current MBSA tools are capable of performing failure propagation simulation, although they are not easily able to provide minimal cut sets, system-level fault trees and the like, which can be verified by a safety analyst. There is no solution available now that can provide all the benefits of MBSA and all the advantages of the FT method that is predominantly used in safety certification.

Example implementations of the present disclosure are generally directed to an improved system for safety analysis of a complex system using component-oriented fault trees. Example implementations facilitate safety analysis in a number of different manners, such as through development of a fault propagation model that can concurrently address the analysis needs of the system design community and the safety certification needs. A system may be modeled from the components of which the system is composed, and the components may be modeled by respective fault trees. In accordance with example implementations, then, component fault-based models may be constructed with failure modes internal to the system's components. The component fault-based models and their respective fault trees may then be assembled into a system fault-based model including an assemblage of the fault trees of its components. This may avoid requiring use of unintuitive languages. Example implementations may therefore enable use of a system fault-based model for visualizing fault propagation on a design model, and for safety certification of the same model.

According to one aspect of example implementations, a safety-analysis system is provided, and includes a system modeler and model-analysis system. The system modeler is configured to receive component fault-based models of respective components of which a system is composed. The component fault-based models include transfer functions expressed as fault trees each of which describes behavior of a respective component in an event of a failure of the respective component or of an input to the component. In some examples, a component failure may be described as a fault tree of subcomponent failures, and this fault tree may be combined with the state of the component inputs and controls to form component transfer functions.

The system modeler is also configured to assemble the component fault-based models into a system fault-based model of the system, with the system fault-based model expressed as an assembly of the fault trees of the component fault-based models. The model-analysis system, then, is configured to perform a safety analysis using the system fault-based model.

In some examples, the component fault-based models may be graphically expressed in block diagrams including blocks representing respective components. In these examples, the system modeler being configured to assemble the component fault-based models into the system fault-based model may include being configured to graphically express the system fault-based model as a block diagram such as a reliability block diagram or functional flow block diagram (FFBD) including the blocks connected to one another. This block diagram may at times be referred to as a fault propagation model.

In some examples, the system modeler being configured to receive the component fault-based models may include being configured to receive the component fault-based models from storage, the component fault-based models being stored in a library of component fault-based models.

In some examples, the safety-analysis system may further include a component modeler configured to develop the component fault-based models of the components. In these examples, the component modeler may be configured to construct the component fault-based models, and the transfer functions of the component fault-based models. Each of at least some of the component fault-based models may include an output and a failure event of a respective component, perhaps also an input. The transfer function describes a logical relationship between the input, output and failure event of the respective component. And the system modeler being configured to receive the component fault-based models may include being configured to directly or indirectly receive the component fault-based models from the component modeler.

In some further examples, each of the at least some of the component fault-based models further may include an external input or control, and the transfer function describes a logical relationship between the external input, control, output and failure event of the respective component. In these further examples, the system modeler being configured to assemble the component fault-based models may include being configured to connect an output of a component fault-based model to an input of another component fault-based model, or to a Boolean logic operation (e.g., AND, OR, NOT) that outputs to an input of another component fault-based model. For example, in instances in which the system fault-based model is expressed as a FFBD, component outputs may be connected to input(s) of other components through appropriate Boolean logic operations or gates.

In some examples, the model-analysis system being configured to perform the safety analysis may include being configured to perform a fault-tree analysis using the system fault-based model, and generate one or more minimal cut sets and probabilities for one or more failure conditions based thereon.

In some examples, the model-analysis system being configured to perform the safety analysis may include being configured to generate a fault propagation model based on at least some of the component fault-based models or system fault-based model. In these examples, the fault propagation model may include one or more failure propagation paths and failure probabilities of inputs and outputs along the failure propagation path(s).

In other aspects of example implementations, a method and computer-readable storage medium are provided for performing a safety analysis. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

Figure 6:
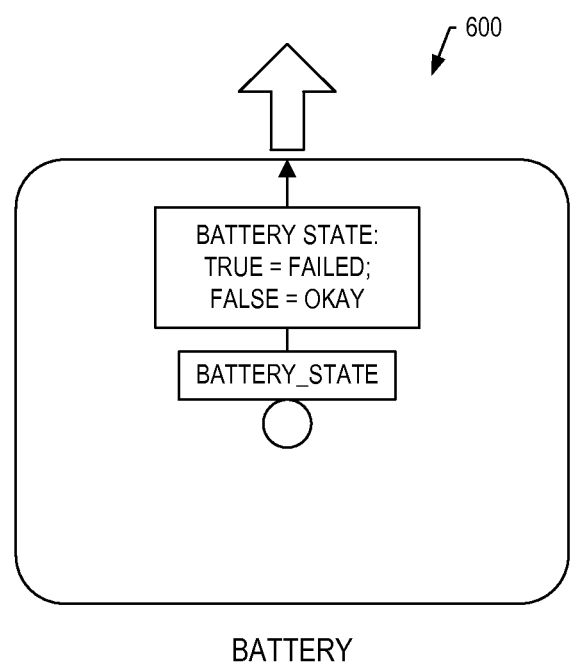
FIGS. 6, 7, 8A and 8B illustrate examples of suitable fault-based models for components of a flashlight including a battery, bulb and switch, respectively, according to example implementations of the present disclosure.
Figure 7:
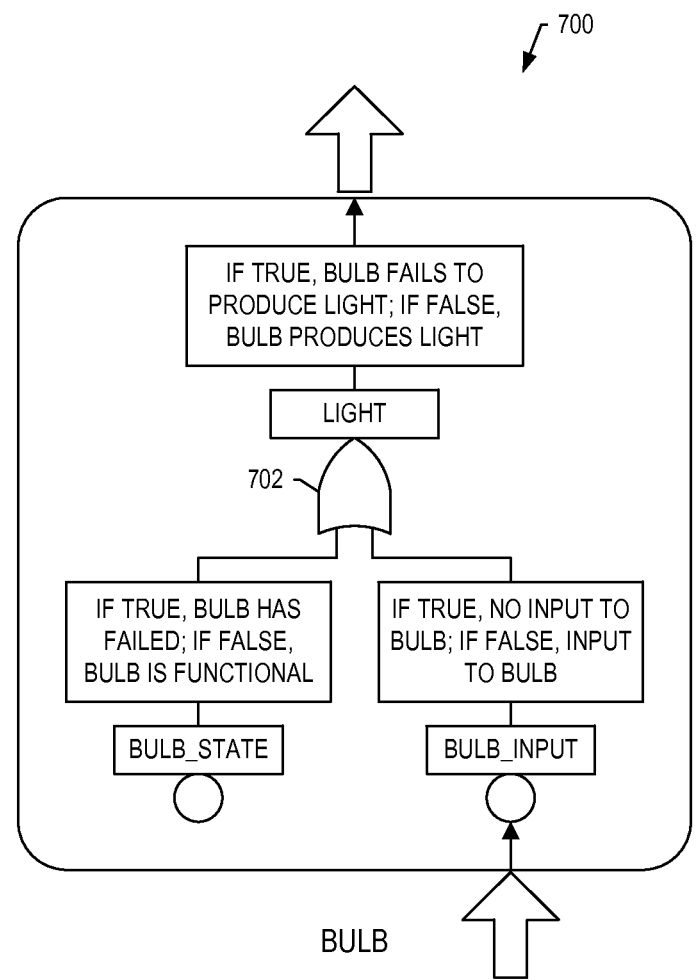
Figure 13:
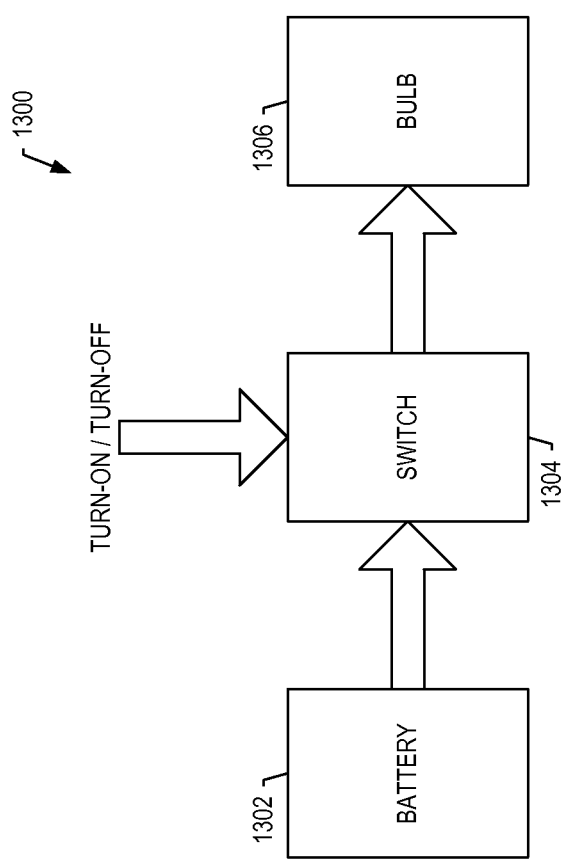
Figure 14:
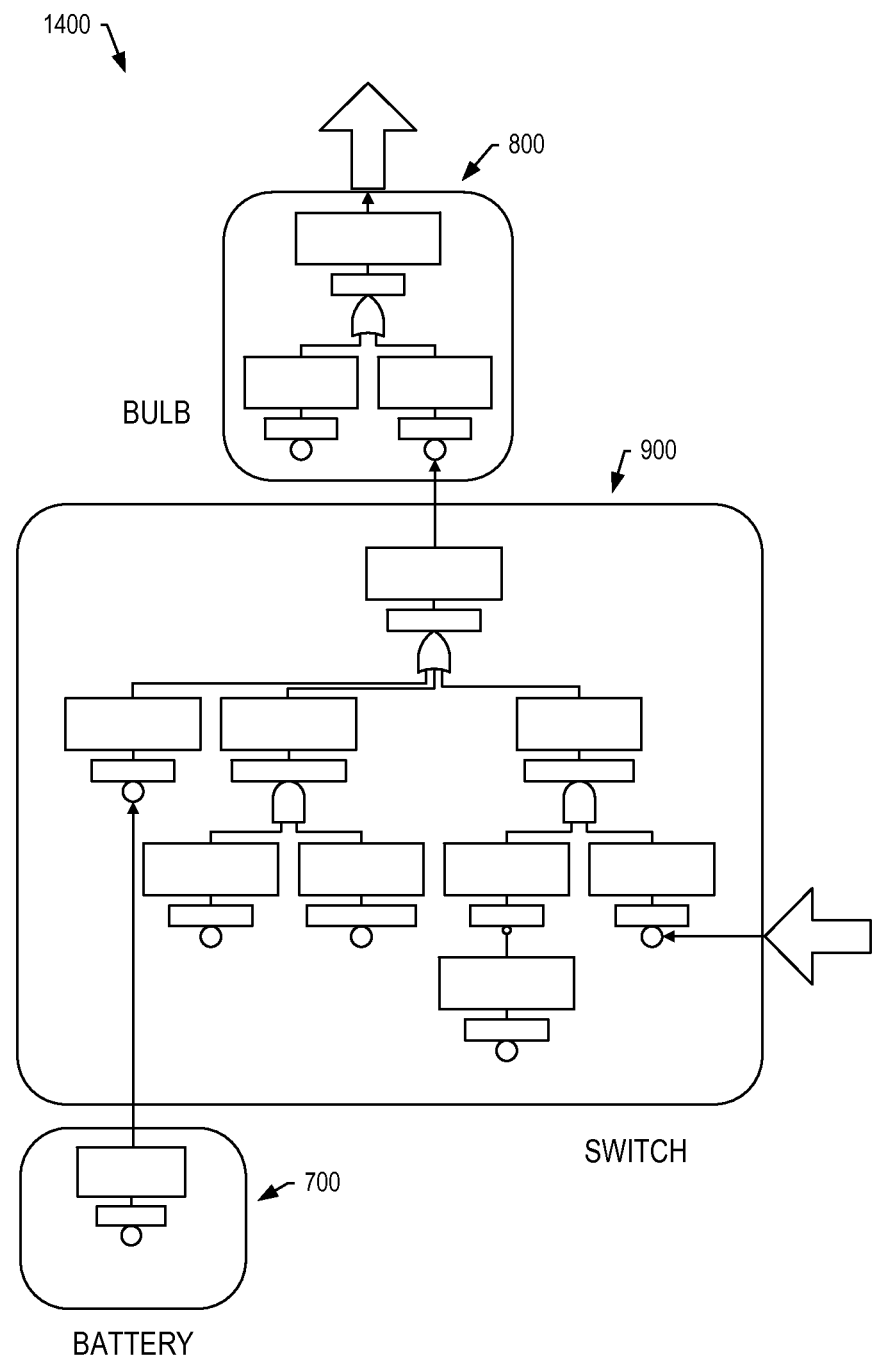
Figure 15:
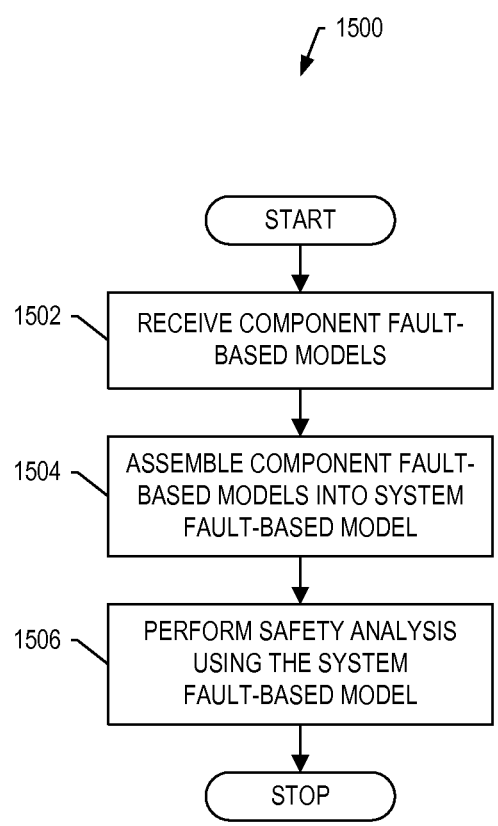

FIGS. 9, 10, 11 and 12 further illustrate behavior of a fault-tree transfer function of the switch for respective ones of the cases: (a) the switch okay, turn-on command, (b) the switch okay, turn-off command, (c) the switch has failed, stuck closed, and (d) the switch has failed, stuck open, according to example implementations of the present disclosure;

FIG. 13 illustrates a system fault-based model in the form of a reliability block diagram of the aforementioned flashlight, according to example implementations of the present disclosure;

FIG. 14 illustrates a reliability block diagram that corresponds to that of FIG. 13, but that includes the component fault-based models of the battery, bulb and switch shown in FIGS. 6, 7 and 8, according to example implementations of the present disclosure; and FIG. 15 illustrates various operations in a method according to example implementations of the present disclosure.

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Also, something may be shown or described as being above something else (unless otherwise indicated) may instead be below, and vice versa; and similarly, something shown or described as being to the left of something else may instead be to the right, and vice versa. Like reference numerals refer to like elements throughout.

Example implementations of the present disclosure relate generally to safety analysis and, in particular, to safety analysis of a complex system such as an aircraft using component-oriented fault trees. Example implementations will be primarily described in conjunction with aerospace applications in which the complex system may be an aircraft. It should be understood, however, that example implementations may be utilized in conjunction with a variety of other applications, both in the aerospace industry and outside of the aerospace industry (e.g., automotive, marine, electronics). Accurate and consistent safety analysis is important because it can impact multiple aspects of equipment operations, including safety, operations, maintenance, engineering support and the like.

A complex system such as an aircraft may be generally composed of a hierarchy of assembled components. For example, a complex system may include a number of parts each of which includes one or more features. The parts may be may be assembled into a number of assemblies, subsystems or the like (each generally a "subsystem"). And the subsystems (alone or with various parts) may be in turn assembled into other subsystems or the complex system itself. In various examples, then, a "component" in the context of a complex system may refer to a feature (of a part), a part (of a subsystem) or a system (of the complex system); and a "system" in the context of the complex system may refer to an assemblage of components, such as a part, subsystem or the complex system. In the context of an aircraft, one or more components may be designed as a modular component of the aircraft often referred to as a line-replaceable unit (LRU), of which a single aircraft may include a number of LRUs and other components.

As described herein, a system may present a failure condition (sometimes referred to as a hazard) caused by one or more component faults or failures (generally "failures"). A system may fail in any of a number of different manners such as by malfunction, degradation or failure, each of which may refer to a failure mode (as described herein, reference to a failure may at times equally apply more particularly to a failure mode). In some examples, a failure case or scenario (generally "scenario") may describe a system failure, beginning with one or more component faults that lead to a system failure condition. A failure effect may refer to the operation of a component or system as the result of a failure; that is, the consequence(s) that a failure mode has on the operation, function or state of a component or system. And in some examples, a failure or failure effect may become a failure condition.

Figure 1:
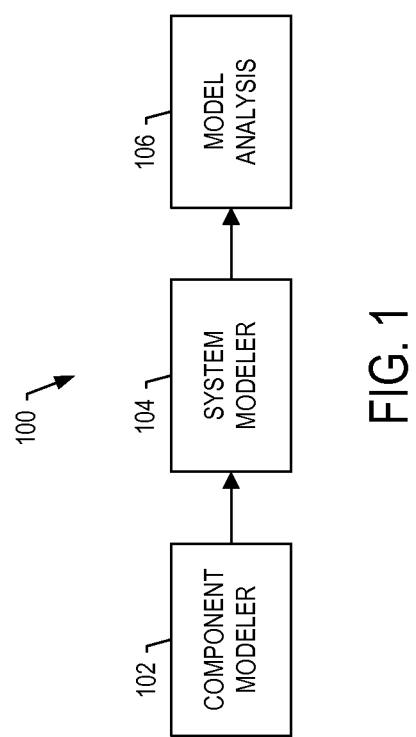
FIG. 1 is an illustration of a safety-analysis system in accordance with an example implementation.

Referring now to FIG. 1, a safety-analysis system 100 is illustrated according to example implementations of the present disclosure. The system may include any of a number of different subsystems (each an individual system) for performing one or more functions or operations. As shown, for example, the safety-analysis system 100 may include a component modeler 102, system modeler 104 and/or model-analysis system 106. Although shown as part of the safety-analysis system 100, one or more of the component modeler 102, system modeler 104 and/or model-analysis system 106 may instead be separate from but in communication with the safety-analysis system 100. It should also be understood that one or more of the subsystems may function or operate as a separate system without regard to others of the subsystems. And further, it should be understood that the safety-analysis system 100 may include one or more additional or alternative subsystems than those shown in FIG. 1.

The component modeler 102 of the safety-analysis system 100 may be generally configured to develop component fault-based models of respective components of a complex system. Each component fault-based model may describe behavior of a respective component, and include a transfer function that relates various inputs and/or controls to respective outputs of the component. In accordance with example implementations, the transfer function may be expressed as a fault tree that describes the behavior of the component in the event of one or more failures of the component or of one or more inputs to the component. The transfer function may describe output of a component in the event of one or more failures, independent of or further dependent on one or more inputs and/or controls. This may benefit the safety analysts who often use fault trees for safety analysis. The logic may also be more easily understood by appropriate regulatory authorities, such as the Federal Aviation Administration (FAA), European Aviation Safety Agency (EASA) and the like.

The system modeler 104 may be configured to develop one or more system fault-based models of respective one or more systems of the complex system. As explained above, a system may refer to an assembly of components. In some examples, then, the system modeler 104 may be configured to assemble component fault-based models of components of a system into the system fault-based model for the respective system. Similar to the component fault-based models, then, the system fault-based model may describe behavior of a respective system, and may include a transfer function that relates various inputs and/or controls to respective outputs of the system. This transfer function may be expressed as an assembly of the fault trees of the components of the system, and the inputs, controls and outputs may more particularly refer to those of the components.

The model-analysis system 106 may be configured to perform a safety analysis using the system fault-based model, such as in accordance with any of a number of different safety analysis techniques. For example, the model-analysis system 106 may perform a fault tree analysis in which the causes of a failure effect may be analyzed using logic that combines contributing failures. The model-analysis system 106 may perform its safety analysis and generate one or more safety artifacts based thereon, such as probabilities and minimal cut sets for one or more failure conditions.

In some examples, the model-analysis system 106 may generate one or more fault propagation models based on various fault-based models (component and/or system fault-based models) and/or cut sets, and which may describe propagation of one or more failures across components or systems. These fault propagation models may be used for any of a number of different purposes, such as by the model-analysis system 106 to perform a model-based safety analysis (MBSA). In some examples, various fault-based models and/or cut sets may be used to propagate failures, and power the visualization of a MBSA fault propagation model, which may be built using a number of different user interfaces. In this regard, the fault propagation model may include one or more failure propagation paths and failure probabilities of inputs and outputs along the failure propagation path(s).

Figure 2:
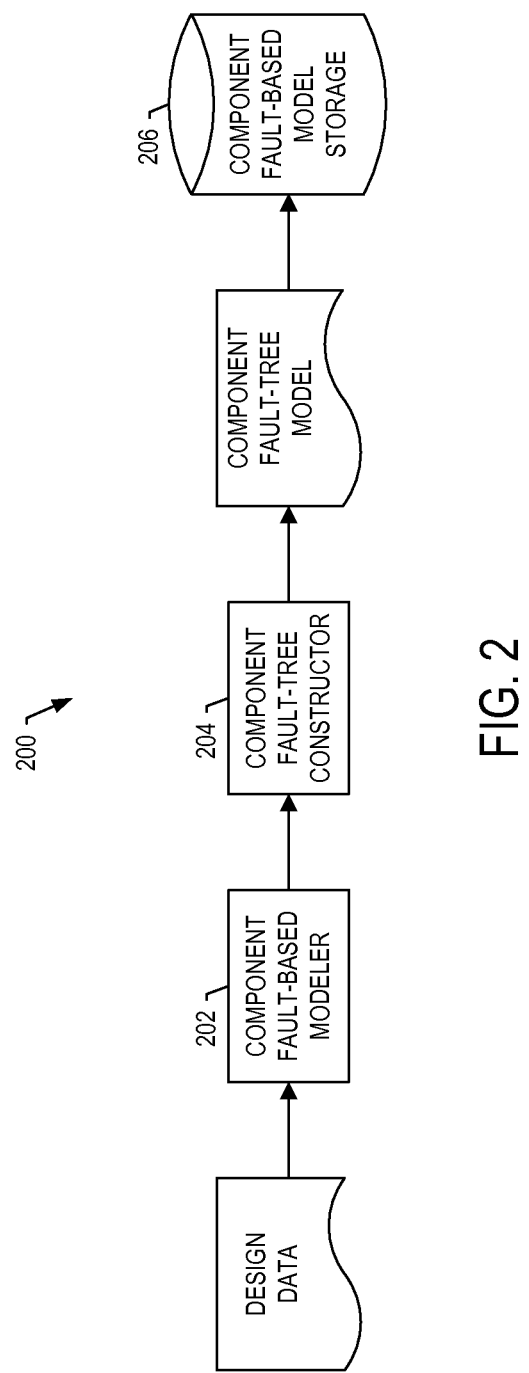
FIGS. 2 and 3 illustrate a suitable component modeler and system modeler, respectively, according to example implementations of the present disclosure.
Figure 3:
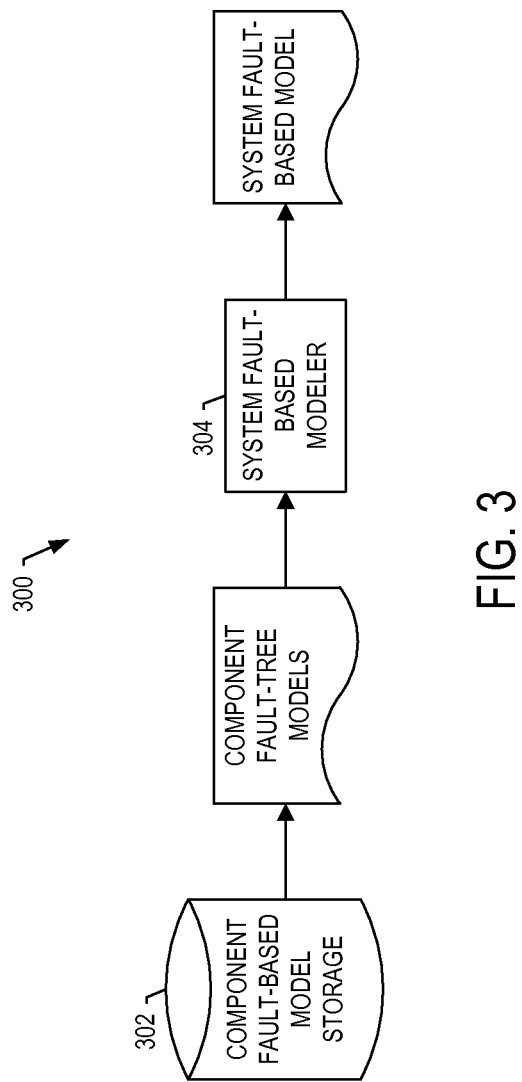

Reference will now be made to FIGS. 2 and 3, which illustrate more particular examples of a suitable component modeler 102 and system modeler 104, respectively, according to example implementations of the present disclosure.

FIG. 2 illustrates a component modeler 200, which in one example implementation may correspond to component modeler 102. The component modeler 200 may be generally configured to develop component fault-based models of respective components of a complex system. As shown, for example, the component modeler 200 may include a component fault-based modeler 202, component fault-tree constructor 204 and appropriate component fault-based model storage 206, which may be coupled to one another to form the component modeler 200.

The component fault-based modeler 202 may be configured to receive design data describing the complex system, its systems and/or components, and safety data describing possible failures of the complex system, its systems and/or components. The design data may include, for example, data related to the architecture, operating modes and/or behavior/interactions of the complex system and its components. The architecture data may include, for example, a model the complex system's architecture, function, systems, functional flow (e.g., energy, matter, information) and the like. The architecture data may include a model of the complex system's safety-critical systems and flows (e.g., energy, matter, information), and/or a model of operator (e.g., pilot) commands, one or more sensors (e.g., air data) and the like.

The operating-modes data may include a model of operating modes of the complex system. This may include operating modes of various components and/or systems of the complex system, such as those visible across component/system boundaries. In one example, the model may include operational-dependent behavior, such as flight-phase dependent behavior.

The behavior/interactions data may include, for example, a model of behavior and/or interactions of components and/or systems of the complex-system (a behavior/interactions model). In some examples, this behavior/interactions model may include logical one or more relationships between components/systems, and which logical relationship(s) may be reflected by logical interfaces between the respective systems. Logical interfaces between a component/system and one or more other components/systems may indicate systems where effects (e.g., actual effect, reduction in redundancy, "no effect," etc.) should be expected in the event of failure of the respective component/system. Logical interfaces may be provided by appropriate data, such as that provided by an interface control document (ICD). In some examples, the behavior/interactions model may include transfer functions (at some level of abstraction).

The safety data may include, for example, data related to failure modes, failure conditions and/or common cause failures of the complex system and its components. The failure-mode data may include a model of failure modes of the complex system and its components, or rather failure modes that the complex system its components may experience. Some examples of suitable failure modes may include the failure-off (loss of function) of a number of systems or operations of respective systems, such as liquid cooling, equipment-bay cooling, air conditioning, electrical buses, pumps, transformer-rectifiers and the like. Other examples of suitable failure modes may include loss or degradation of brakes, failed thrust reverser and the like.

Failure-conditions data may include a model of failure conditions of the complex system and its components. This may include failure conditions that may be presented by the complex system and its components, logic according to which the failure conditions may be presented, and/or failure modes to which the failure conditions may lead or contribute. In some examples, this model may reflect model propagated (cascading) failures and effects to which the failure conditions may lead or contribute. Examples of propagated failures may include loss of satellite communication due to load shed, loss of transceiver due to loss of power to bus, loss of motor controller due to loss of liquid cooling, and the like.

The model of failure conditions may also include a severity (or hazard level) and/or probability for the failure conditions. In some examples, the severity may indicate the effect of the failure condition on occupants and/or operations of the complex system, and the probability may indicate the chance of the failure condition occurring. In one example, the failure conditions, logic, levels and probabilities may be given by a system safety assessment (SSA) and/or functional hazard assessment (FHA). In one example, severity may be numerically represented, such as in order from "one" to "five" in increasing severity. In another example, severity may be given by categories, such as by the following in increasing severity: "no safety effect," "minor," "major," "hazardous" and "catastrophic."

The common-cause-failure data may include a model of common cause failures of the complex system and its components. This model focuses on dependencies of failures that may otherwise be treated as independent. These dependencies may be reflected in a number of different manners, such as by physical and/or functional proximity (e.g., zonal proximity) or interaction, shared components, and the like.

Regardless of the exact content of the design and safety data, the component fault-based modeler 202 may be configured to construct fault-based models of respective components of the complex system, from the design and safety data. For each component, the design and safety data may reflect one or more external inputs, one or more controls (commands) to the component, and/or one or more outputs from the component. The design and safety data may also reflect one or more internal events and states of the component; and the design and safety data may reflect one or more transfer functions that describe logical relationship(s) between the inputs, controls, outputs, events and states. The inputs may include, for example, an input to a component from another component, an output of a Boolean logic operation (e.g., AND, OR, NOT) that takes its inputs from other components (e.g., in the case of a functional flow block diagram expression), or the like; and the controls may include, for example, a command from an operator of the component. The outputs may include, for example, an output from the component in response to an input or event. The events may include, for example, one or more primary events, external events and/or common cause events, one or more of which may be a failure (or failure event) experienced by the component. Similarly, the states may include, for example, one or more operations, functions or states of the component, one or more of which may be a failure effect. And as suggested above, in some examples, one or more of these failures or failure effects may become a failure condition.

The transfer function may describe logical relationship(s) between the inputs, controls, outputs, events and states in a number of different manners. In accordance with example implementations of the present disclosure, the transfer function may describe the logical relationship(s) for failure-based events and states, namely, failures and failure effects. The transfer function may describe the logical relationship(s) between inputs, controls, outputs, failure events and failure effects.

Figure 4:
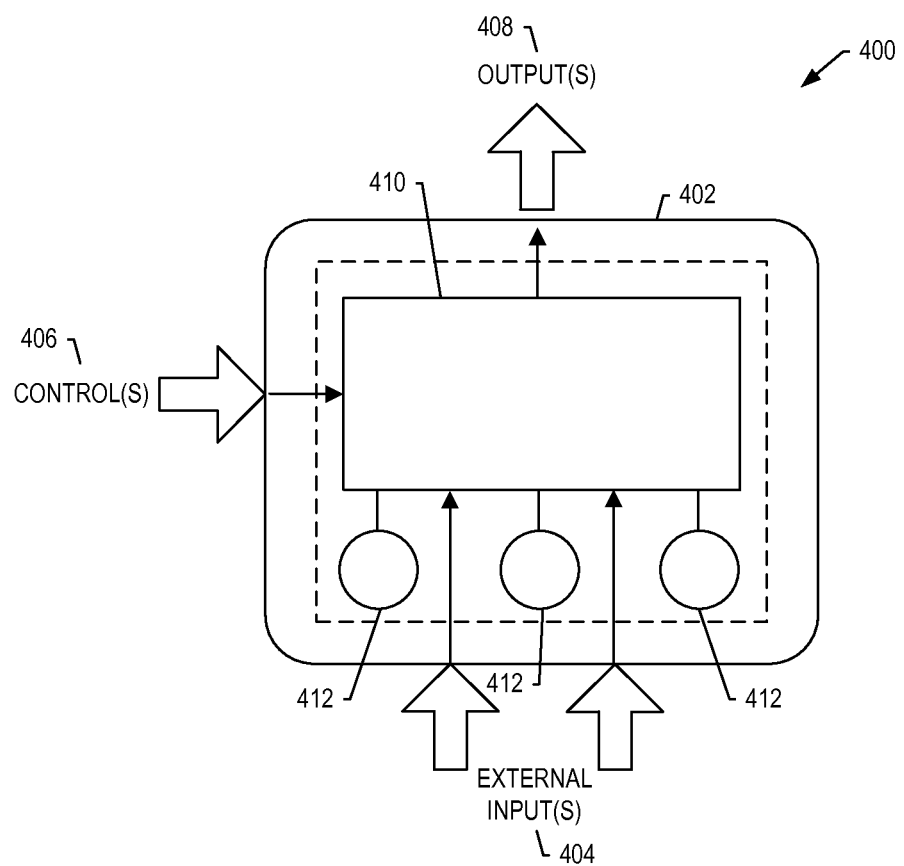
FIG. 4 illustrates an example of a graphical representation of a component fault-based model, according to example implementations of the present disclosure.

The fault-based model of a component constructed by the component fault-based modeler 202 may be expressed in a number of different manners. In some examples, the fault-based modeler 202 may be configured to graphically express the component fault-based model in a block diagram. FIG. 4 illustrates an example of such a block diagram 400 expression of a component fault-based model. As shown, the block diagram 400 includes a block 402 representing the component, and illustrates external inputs 404 and controls 406 to the component, and outputs 408 from the component. Internal to the component block, the diagram includes a block 410 representing a transfer function describing the logical relationship(s) between external inputs 404, controls 406, outputs 408, failure events and failure effects; and one or more points 412 (shown, for example, as circles) coupled to the transfer-function block that represent points at which failure events may be injected into the component.

In accordance with example implementations, the transfer function may be expressed as a fault tree, which may be constructed by the component fault-tree constructor 204 of the component modeler 200. That is, the component fault-tree constructor 204 may be configured to construct the fault tree to express the transfer function for the component fault-based model constructed by the component fault-based modeler 202. A fault tree may be generally, graphically-expressed as a collection of failure states (failure events) that may lead to a component failure state (failure effect).

A fault tree may also represent a partial success model. A tuple including Boolean values at the fault injection points, and the input states and output states may form a state vector, and the component may transition from state to state based on failure or repair at the fault injection points or change of the input state(s). In some examples, this expression of the transfer function, and the resulting fault-based model, may apply only to a particular scenario; although, it may be possible to expand the transfer function/fault-based model to represent more general success states by adjoining control states and inputs depicting other scenarios.

A Boolean variable may describe only two states, which may be sufficient for purposes of a success/failure model. If more than two states are required, several Boolean variables may be required to model the states. Generally, n variables may describe up to $2^n$ states. More specifically, for example, 2 variables may describe up to 4 states, 3 variables may describe up to 8 states, and so on. This may result in redundant states.

Figure 5:
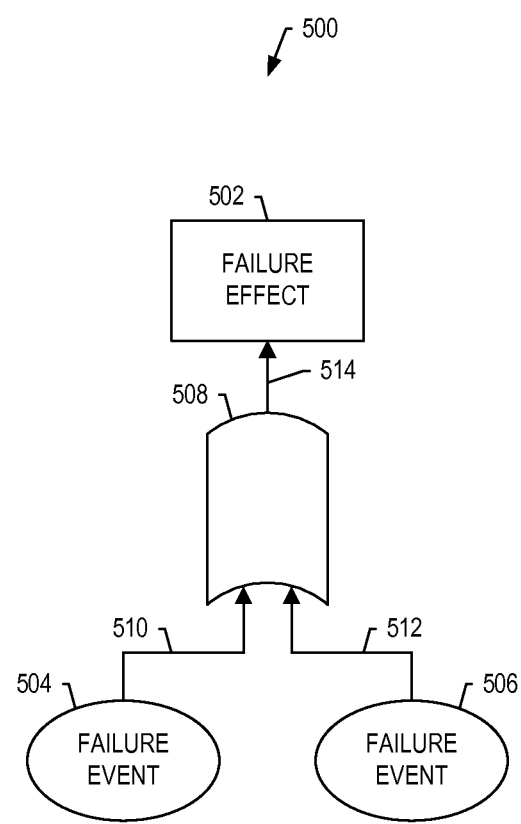
FIG. 5 illustrates an example of a fault tree transfer function, according to example implementations of the present disclosure.

FIG. 5 illustrates a simple fault tree 500 according to example implementations of the present disclosure. As shown, the fault tree 500 includes a plurality of nodes, including one or more gate nodes representing a respective one or more component failure effects (one being shown as gate node or failure effect 502), and a plurality of event nodes representing respective failures (two being shown as event nodes or failures 504, 506). The nodes are interconnected by one or more Boolean logic operations 508 and directed links 510, 512, 514.

In the fault tree 500, the event nodes or failures 504, 506 may be leaf nodes of the tree, and may represent stochastically-independent failures of the component and/or inputs to the component. The remaining node is a gate node or failure effect 502. The gate node represents a failure effect, and integrates events or other gates using one or more Boolean logic operations 508 (e.g., AND, OR, NOT). The nodes are interconnected by directed links 510, 512, 514 so as to form a directed tree.

To more particularly illustrate a fault-based model including a fault-tree transfer function example implementations of the present disclosure, consider the case of a flashlight (system) composed of components including a battery, switch and bulb. FIGS. 6, 7, 8A and 8B (FIGS. 8A and 8B collectively FIG. 8) illustrate examples of suitable fault-based models for the battery 600, bulb 700 and switch 800, respectively, according to example implementations of the present disclosure. As shown in FIG. 6, the battery fault-based model may describe the battery 600 as a simple two state device, which may be described by the following state diagram (truth table), in which inputs and outputs may be given by Boolean values:

| Battery State Diagram | | | | |
|---|---|---|---|---|
| State | Input | Boolean Value | Output | Output Effect |
| Battery has failed | — | T | T | No Power Out |
| Battery is okay | — | F | F | Power Out |

In some examples, the transfer function of the battery fault-based model may be shown simply by an event node. In other examples, the transfer function may be shown by an equivalence gate node or fault tree with multiple gates and events. The equivalence gate node may allow the name of the gate input and battery output to be shown, which may be beneficial in its assembly with other components of the flashlight (as explained below).

The bulb fault-based model 700 may be more complex than that of the battery 600 because the bulb's output depends on both its internal state and input power. As shown in FIG. 7, the bulb fault-based model 700 may include a plurality of nodes interconnected by a Boolean logic OR operation 702 and directed links 510, 512, 514. The bulb fault-based model 700 may describe the bulb as a more complex two state device, which may be described by the following state diagram (truth table):

| Bulb State Diagram | | | | | |
|---|---|---|---|---|---|
| State | Boolean Value | Input State | Boolean Value | Output State | Boolean Value |
| Bulb has failed | T | No Power | T | No Light | T |
| Bulb has failed | T | Power | F | No Light | T |
| Bulb is okay | F | No Power | T | No Light | T |
| Bulb is okay | F | Power | F | Light | F |

Figure 8A:
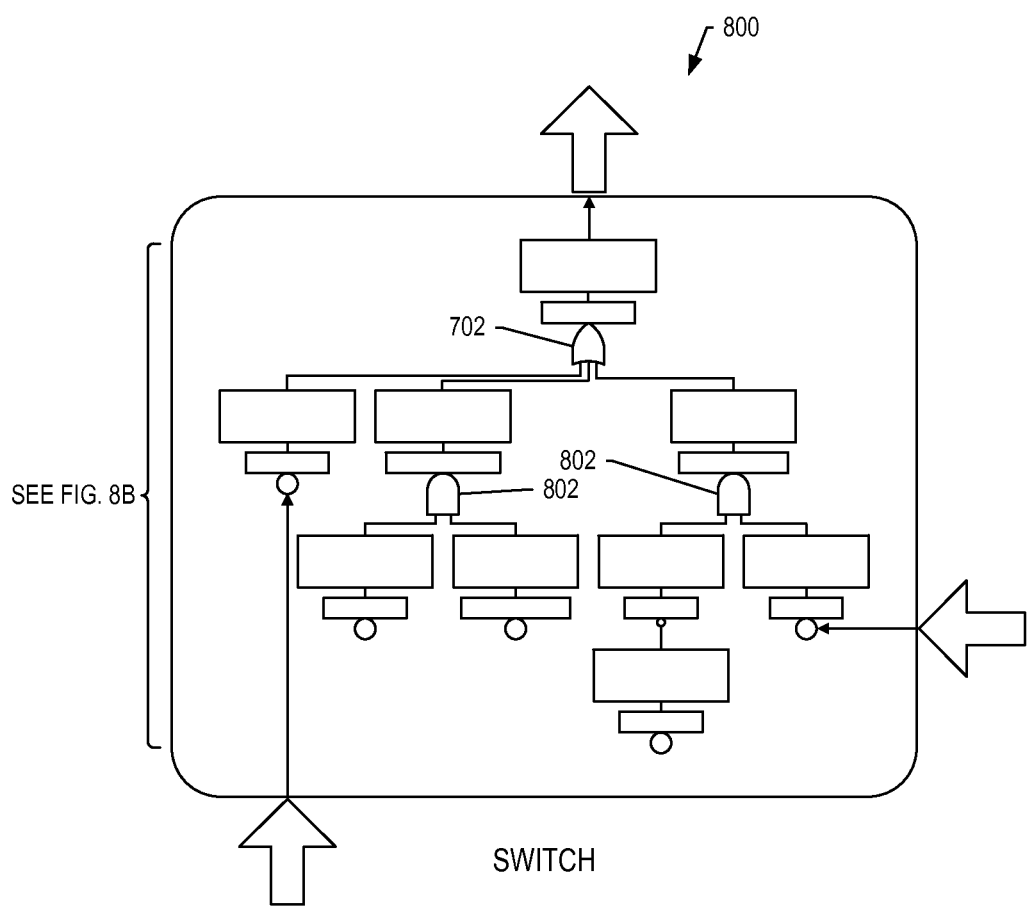
Figure 8B:
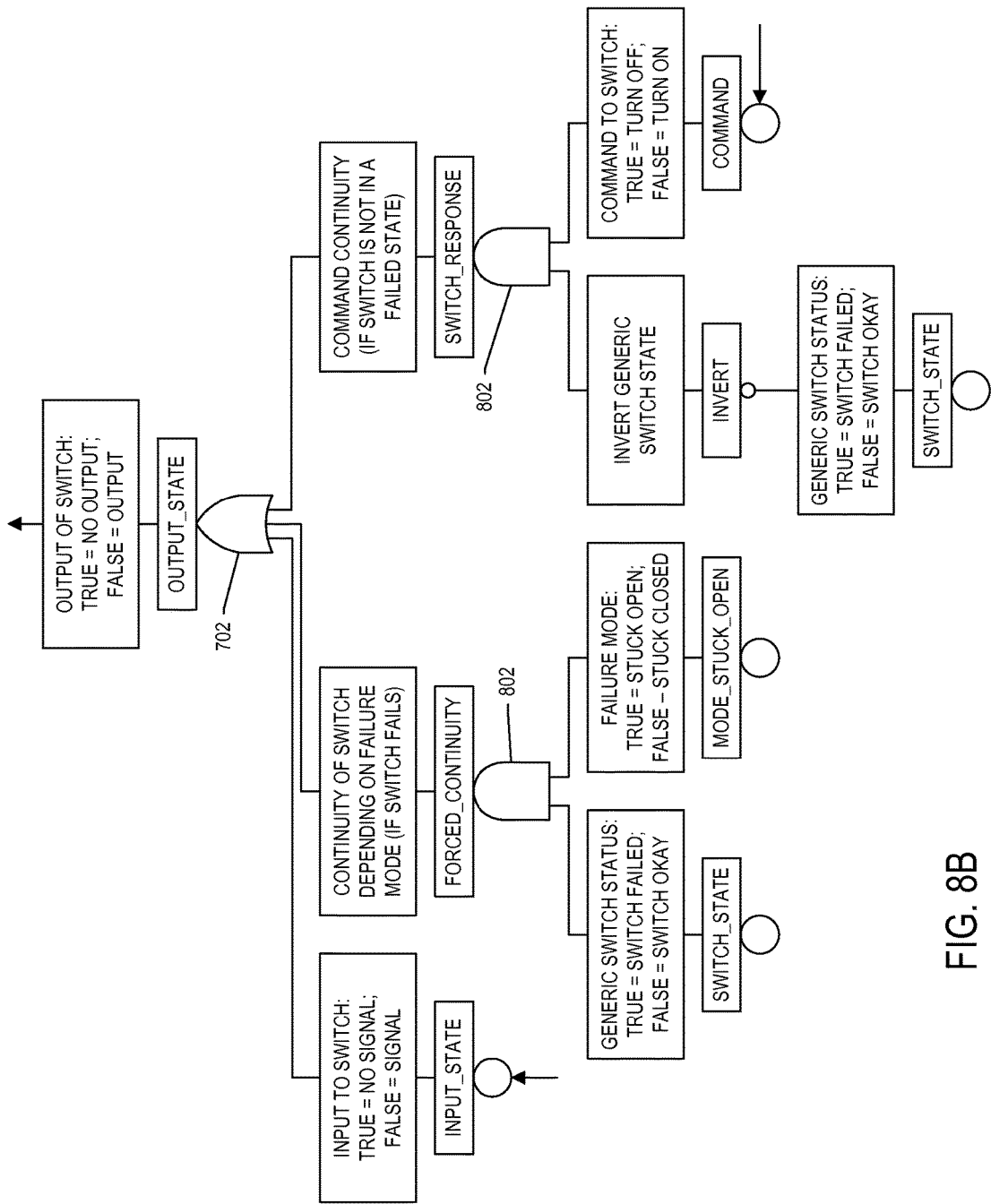
Figure 9:
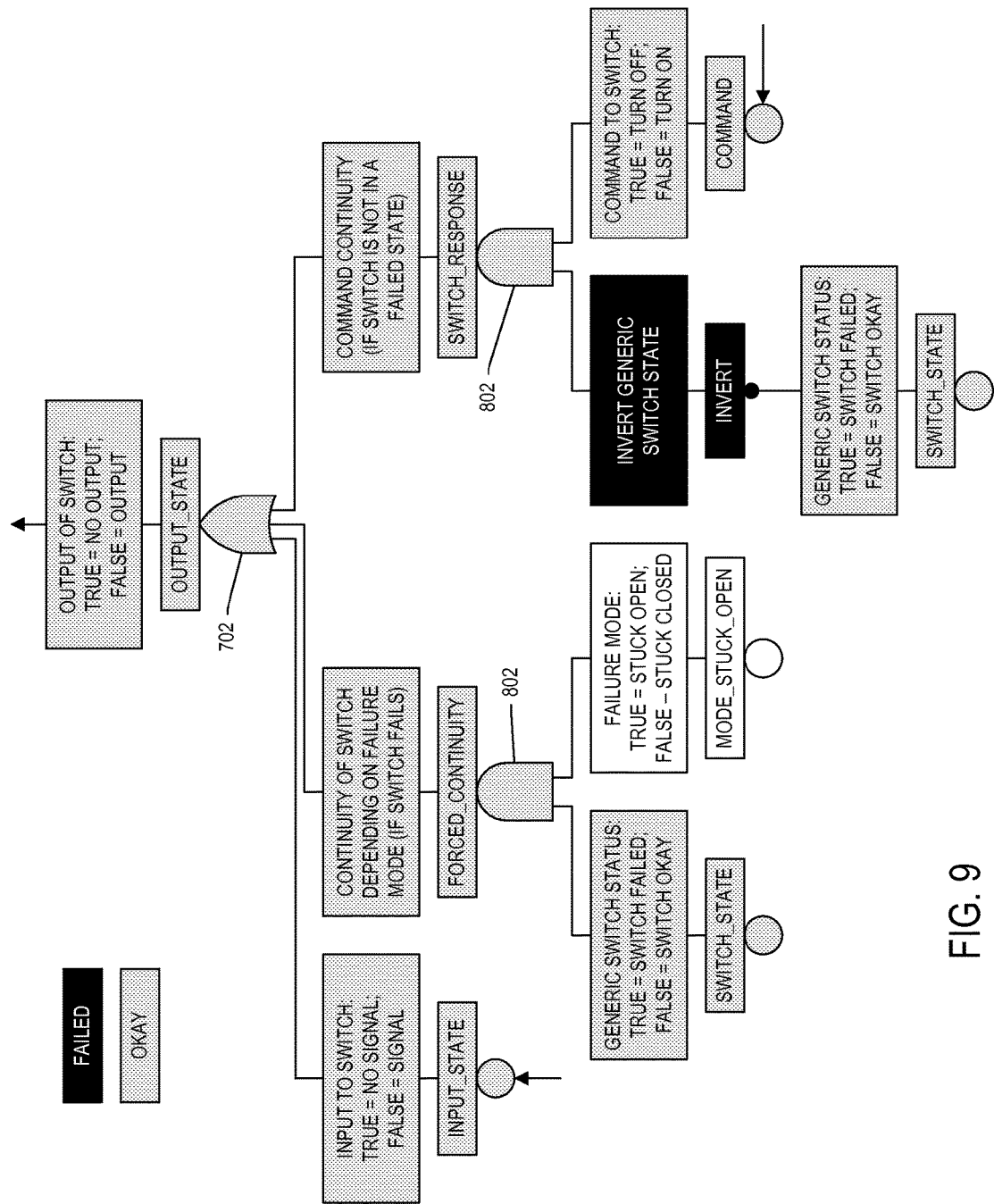
Figure 10:
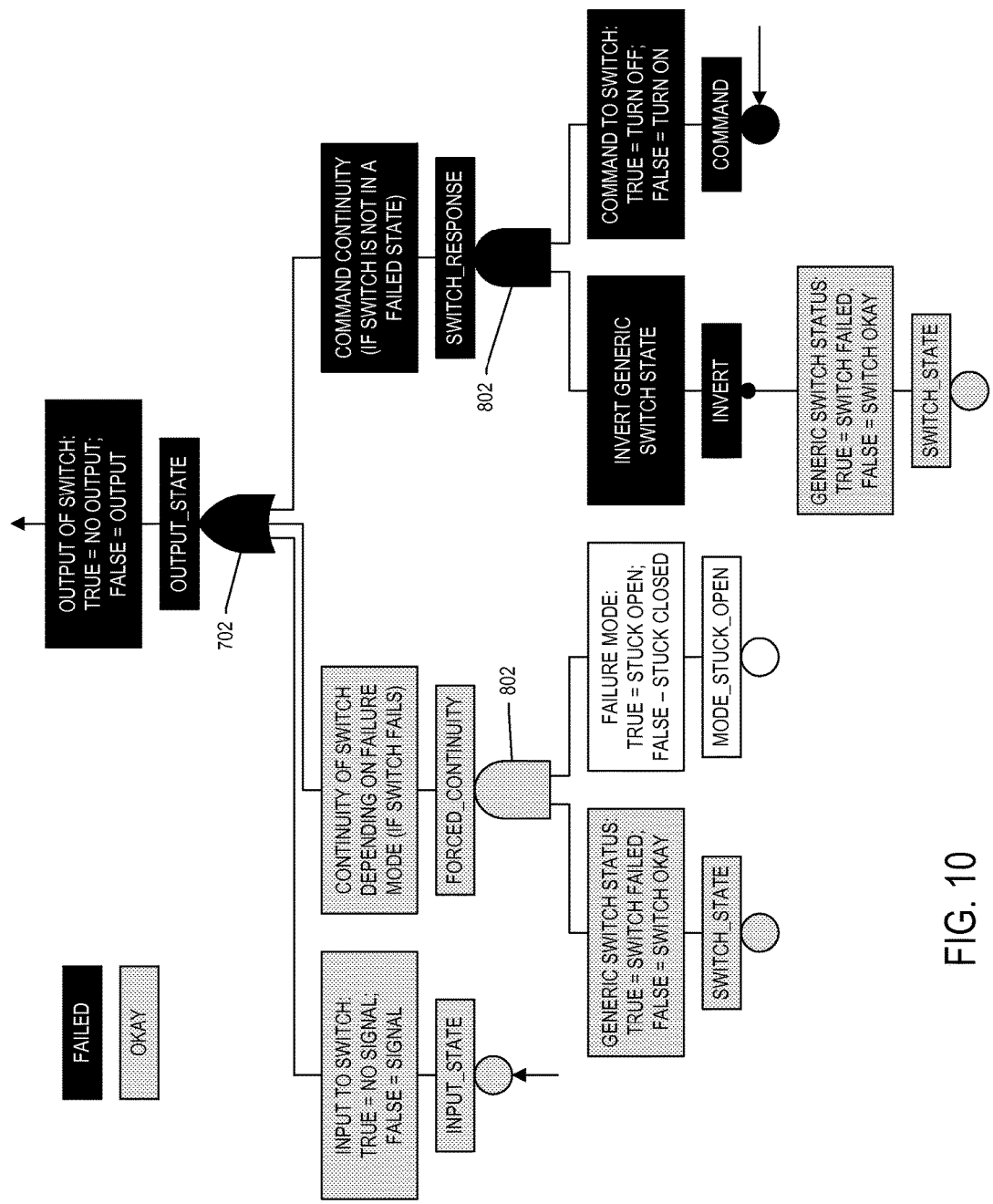
Figure 11:
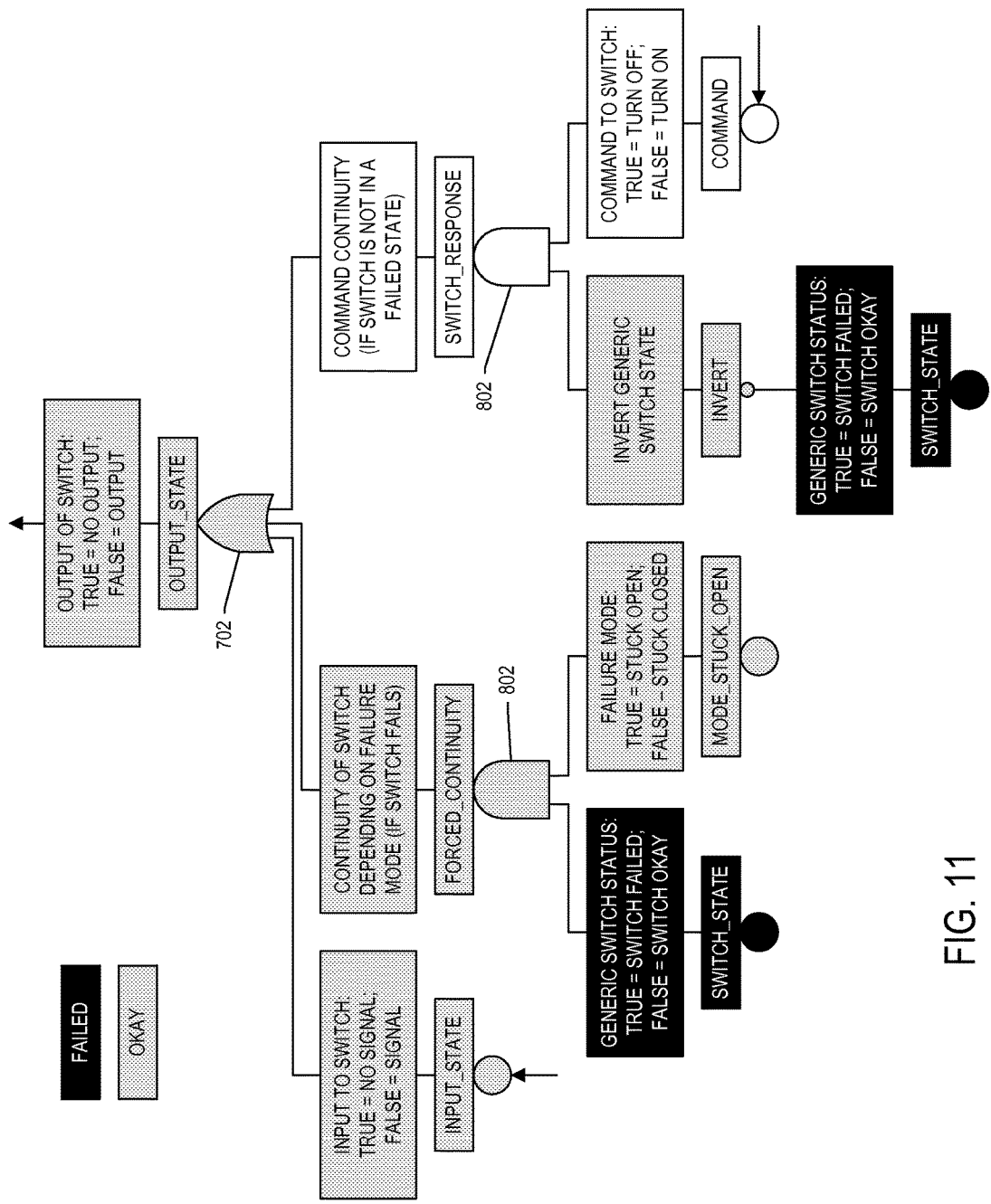
Figure 12:
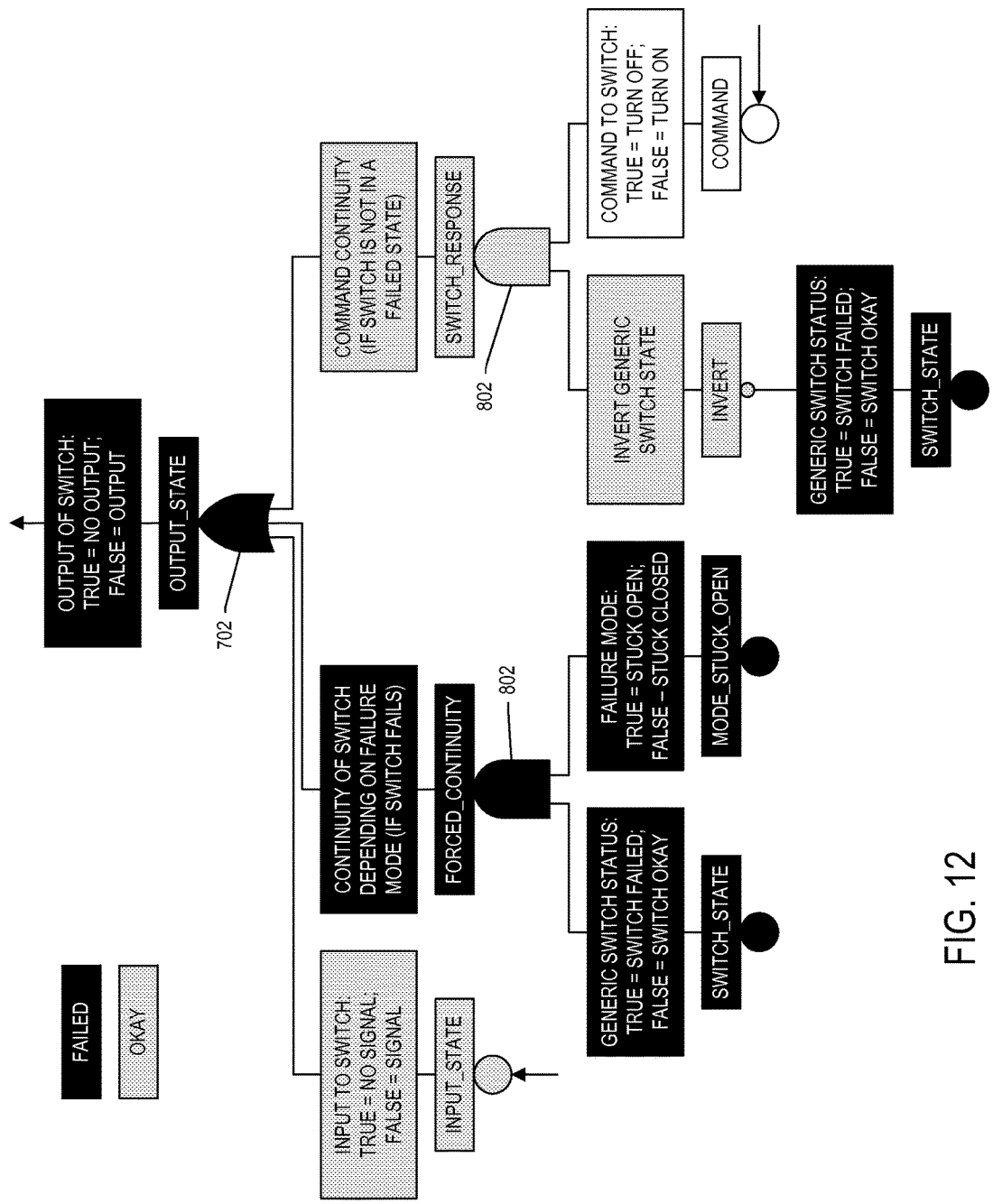

The switch 800 may be driven by a turn-on command or a turn-off command, but experiences two failure modes—namely, stuck open and stuck closed. This may be in contrast to the battery 600 and bulb 700 each of which may have one failure mode. Consequently, as shown in FIG. 8A and more particularly FIG. 8B, the switch fault-based model may describe the switch 800 as an even more complex three state device (switch okay, stuck open and stuck closed). The switch model may include a plurality of nodes interconnected by a Boolean logic OR operation 702, Boolean logic AND operations 802 and directed links 510, 512, 514, and may produce the following state transfer function:

| Switch Transfer Function | | |
|---|---|---|
| Cmd. | State/Failure Mode | Output Effect |
| Turn On | Switch is okay | Output = Input |
| Turn On | Switch stuck open | No Output |
| Turn On | Switch stuck closed | Output = Input |
| Turn Off | Switch is okay | No Output |
| Turn Off | Switch stuck open | No Output |
| Turn Off | Switch stuck closed | Output = Input |

To convert the above to a fault tree, states may be converted to Boolean variables, two of which (SWITCH_FAILURE and MODE) may be used to model the three states of the switch 800 ("Okay," "Failed—stuck open," "Failed—stuck closed). This may be shown as in the table below:

| Definition of Boolean Variables for Switch | | |
|---|---|---|
| Variable | Meaning if True | Meaning if False |
| CMD | Command is "Turn Off Switch" | Command is "Turn On Switch" |
| SWITCH | Switch has failed | Switch functions correctly |
| MODE | Switch failure mode is "Stuck Open" | Switch failure mode is "Stuck Closed" |
| TRANSFER_FUNCTION | No Output | Output = Input |

And after conversion to Boolean notation as per the above, the switch state diagram may be represented as shown below. Here, the failure mode has no meaning if the switch has not failed, but the transfer function must be correct for any values of the three Boolean variables, so those redundant rows are included:

Switch Transfer Function

| Tuple | Switch Status | Failure Mode | Command | Output Effect |
|---|---|---|---|---|
| 1 | Failed | Stuck Open | Turn Off | No Output |
| 2 | Failed | Stuck Closed | Turn Off | Output = Input |
| 3 | Okay | Stuck Open | Turn Off | No Output |
| 4 | Okay | Stuck Closed | Turn Off | No Output |
| 5 | Failed | Stuck Open | Turn On | No Output |
| 6 | Failed | Stuck Closed | Turn On | Output = Input |
| 7 | Okay | Stuck Open | Turn On | Output = Input |
| 8 | Okay | Stuck Closed | Turn On | Output = Input |

When the Boolean input state is included, there may be three Boolean variables representing the internal state tuple (switch failure, switch failure mode, command). And there may be 8 tuples representing the internal transfer function through the switch, such as shown in the following state diagram:

Switch State Diagram

| Tuple | Switch State | Failure Mode | Cmd. | Output Effect |
|---|---|---|---|---|
| 1 | T | T | T | T |
| 2 | T | F | T | F |
| 3 | F | T | T | T |
| 4 | F | F | T | T |
| 5 | T | T | F | T |
| 6 | T | F | F | F |
| 7 | F | T | F | F |
| 8 | F | F | F | F |

As reflected in the Boolean variables definition for the switch, in the above switch state, T=failed, and F=okay; in the failure mode, T=stuck open, and F=stuck closed; in the command (cmd.), T=turn off, and F=turn on; and in the output effect, T=no output, and F=output same as input (output=input).

Note that if the switch has failed, the command status may have no effect, and the switch transfer function may depend only on the failure mode. Conversely, if the switch is operating correctly, the transfer function may depend only on the command. If the switch is operating normally, the failure mode variable may have no meaning Tuples (rows) 3 and 4 represent the same state (combination of state, command status and output), as do rows 7 and 8. The redundancy may result from using four Boolean states to represent three physical states. The complete fault-tree transfer function of the switch may be as shown generally in FIG. 8A, and more particularly in FIG. 8B. FIGS. 9, 10, 11 and 12 further illustrate behavior of the fault-tree transfer function for respective ones of the cases: (a) the switch okay, turn-on command, (b) the switch okay, turn-off command, (c) the switch has failed, stuck closed, and (d) the switch has failed, stuck open. In these figures grey shading indicates that the event or gate is True, and black indicates False; the figures demonstrating the propagation of leaf node values to the OUTPUT STATE.

Returning now to FIG. 2, as or after the component fault-based modeler 202 and component fault-tree constructor 204 construct fault-based models of components including respective fault-tree transfer functions, the fault-based models may be communicated (by the modeler or constructor) to any of a number of different destinations. In one example, the component fault-based models may be communicated to component fault-based model storage 206 for storage and later retrieval, such as in a library of component fault-based models. The storage may be resident with the component modeler 200, or may be separate from and in communication with the component modeler 200. The component fault-based models may be formatted and stored in any of a number of different manners, and hence, their storage may be of any of a number of different types. Examples of suitable types of storage include file storage, database storage, cloud storage or the like.

FIG. 3 illustrates a system modeler 300, which in one example implementation may correspond to system modeler 104. The system modeler 300 may be generally configured to develop one or more system models of respective systems of a complex system, and in which each system may be composed of components. As shown, for example, the system modeler 300 may include component fault-based model storage 302 and a system fault-based modeler 304, which may be coupled to one another to form the system modeler 300.

The system fault-based modeler 304 may be configured to receive fault-based models of the components of a system of the complex system. The component fault-based models may be directly or indirectly received from a component modeler (e.g., component modeler 200). In some examples, the component fault-based models may be stored in component fault-based model storage 302 (e.g., in a library of component fault-based models), which in one example may correspond to component fault-based model storage 206 shown in FIG. 2. In some examples, a system may include multiple instances of a component; and in these examples, the system fault-based modeler 304 may be configured to receive the fault-based model of the component, and replicate it for each instance of it in the system.

The system fault-based modeler 304 may be configured to construct a fault-based model of the system from the fault-based models of its respective components. For example, the system fault-based modeler 304 may be configured to assemble the system's component fault-based models into the system fault-based model, in which in which inputs and outputs of the system's components may be appropriately connected to one another. That is, for each of at least some of the component fault-based models, the system fault-based modeler 304 may connect an output of the component fault-based model to an input of another component fault-based model, or to a Boolean logic operation (e.g., AND, OR, NOT) that outputs to an input of another component fault-based model. In one example, the system fault-based modeler 304 may be configured to graphically express the system fault-based model in a block diagram of the system such as a reliability block diagram (sometimes referred to as a dependence diagram), a functional flow block diagram (FFBD), or the like. In this block diagram, the system may be expressed as blocks representing its components connected to one another.

FIG. 13 illustrates a system fault-based model in the form of a reliability block diagram 1300 of the aforementioned flashlight example including a battery 1302, switch 1304 and bulb 1306. As shown, an output of the battery 1302 is input to the switch 1304 whose output may be input to the bulb 1306, and which switch may receive one or more controls (turn-on, turn-off). FIG. 14 in turn illustrates a reliability block diagram 1400 that corresponds to the reliability block diagram 1300 of FIG. 13, but that includes the component fault-based models of the battery 600, bulb 700 and switch 800.

According to example implementations of the present disclosure, the system fault-based model and component fault-based models of which it is composed may be combined models that are similar to design models but include aspects of failure models. This approach may provide a beneficial compromise between success and failure models. The system fault-based model may also be advantageous over a fault-injection model in that a complete fault tree for the system may be seen directly from the assembly of component fault-based models including their respective fault trees. And accurate probabilities and complete cut sets can be calculated. Moreover, libraries of component fault-based models may be assembled for reuse (e.g., in component fault-based model storage 302). In some examples, a library may include component fault-based models composed from one or more other libraries of component fault-based models.

Returning to FIG. 1, as explained above, the model-analysis system 106 may perform a safety analysis of a complex system using the system fault-based model, and generate one or more safety artifacts based on the analysis. In a system fault-based model such as that represented by the reliability block diagram 1400 shown in FIG. 14, so-called "top events" may represent high-level failure events in the system, which may be considered the failure or operational effects of the system. In some examples, the model-analysis system 106 may generate or otherwise calculate safety artifacts such as failure probabilities and minimal cut sets for at least some of the top events, and perhaps also intermediate failure events underneath the top events in the system fault-based model. The model-analysis system 106 may be configured to generate or otherwise calculate the failure probabilities and minimal cut sets in a number of different manners. For example, the model-analysis system 106 may develop minimal cut sets according to techniques in which the Boolean expression for a failure event (top or intermediate) may be reduced to a "sum of products" form using rules of Boolean algebra. And in some examples, the model-analysis system 106 may calculate failure probabilities directly by truth-table techniques, binary decision diagram techniques or the like, or indirectly from the minimal cut sets using techniques such as inclusion-exclusion, sum-of-disjoint-products or the like.

Safety artifacts such as minimal cut sets may represent system failure behavior and reveal many safety aspects of the system when performing techniques such as MBSA. Consider for example a minimal cut set that has only a single term such as a failure mode in one of the components in the system. In this example, the minimal cut set may be interpreted to understand that the system top event may be triggered by a single point failure of that component, which may be nearly always undesirable. More terms in the cut set may imply that multiple independent failures of different components may be required in combination with potentially an operational command to create the system top event. This may not be otherwise foreseen by a system designer, and thus the MBSA may facilitate discovery of such safety scenarios, which may be remedied by a change in design and/or operational procedures of the system. The probability of each minimal cut set may also illustrate how frequently a failure event may be triggered during the life of the system.

As also suggested above, the safety analysis performed by the model-analysis system 106 may be used during design, development and certification of the complex system. In the context of an aircraft, regulatory authorities such as the FAA, EASA and the like often stipulate stringent requirements for safety certification of the aircraft, and these requirements may not tolerate "single failures" in an aircraft design. In instances in which MBSA reveals minimal cut sets with only one term, aircraft designers may add redundancy to the system and aircraft or failure prevention methods. Also depending on the severity of the system failure events, the requirements for safety certification may limit the probability or frequency of a failure event. Top event and intermediate event probabilities and cut set probabilities produced by MBSA may reveal whether or not an aircraft design complies with the requirements. Techniques such as MBSA may be used to produce artifacts such as failure probabilities of intermediate events and also cut sets and their probabilities, and also provide a visual overlay of the artifacts, which may improve the effectiveness of an aircraft design for safety and certification.

FIG. 15 illustrates various operations in a method 1500 according to example implementations of the present disclosure. As shown at block 1502, the method 1500 may include receiving component fault-based models of respective components of which a system is composed. The component fault-based models may include transfer functions expressed as fault trees each of which describes behavior of a respective component in an event of a failure of the respective component or of an input to the component. The method 1500 may also include assembling the component fault-based models into a system fault-based model of the system, as shown in block 1504. Here, the system fault-based model may include a transfer function expressed as an assembly of the fault trees of the component fault-based models. And as shown in block 1506, the method 1500 may include performing a safety analysis using the system fault-based model.

According to example implementations of the present disclosure, the safety-analysis system 100 and its subsystems including the component modeler 102, system modeler 104 and model-analysis system 106 may be implemented by various means. Similarly, the examples of a component modeler 200 and system modeler 300, including each of their respective elements, may be implemented by various means according to example implementations. And the method 1500 of example implementations may be implemented by various means. Means for implementing the systems, subsystems and their respective elements, and the methods described herein, may include hardware, alone or under direction of one or more computer program code instructions, program instructions or executable computer-readable program code instructions (at times generally referred to as "computer programs," e.g., software, firmware, etc.) from a computer-readable storage medium.

In one example, one or more apparatuses may be provided that are configured to function as or otherwise implement the systems, subsystems and respective elements shown and described herein, such as to carry out operations of methods shown and described herein. In examples involving more than one apparatus, the respective apparatuses may be connected to or otherwise in communication with one another in a number of different manners, such as directly or indirectly via a wired or wireless network or the like.

Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory (of the same or another apparatus).

The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of computer hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wire) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein, such as to carry out operations of methods shown and described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which these disclosure pertain having the benefit of the teachings presented in the foregoing descriptions and the associated drawings. Therefore, it is to be understood that the disclosure are not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
designing and thereby producing a design of a complex system embodied as an aerospace, automotive, marine or electronics system including a hierarchy of assembled components, designing the complex system including:
receiving component fault-based models of respective ones of the assembled components, the component fault-based models including transfer functions expressed as fault trees each of at least some of which describes output of a respective component of the assembled components in a failure mode of the respective component in response to a failure event, and describes output of the respective component in an operating mode of the respective component in response to an internal state of the respective component, or an external input or command to the respective component;
assembling the component fault-based models into a system fault-based model of the complex system, the system fault-based model including a transfer function expressed as an assembly of the fault trees of the component fault-based models, the assembly of the fault trees describing behavior of the complex system in a failure mode of the complex system, and describing behavior of the complex system in an operating mode of the complex system;
performing a safety analysis using the system fault-based model, wherein performing the safety analysis includes generating a fault propagation model based on at least some of the component fault-based models or system fault-based model, the fault propagation model including one or more failure propagation paths and failure probabilities of inputs and outputs along the one or more failure propagation paths; and
determining if the design of the complex system complies with requirements for safety certification of the complex system based on the safety analysis; and
developing the complex system according to the design when the design complies with the requirements.

2. The method of claim 1, wherein the component fault-based models are graphically expressed in block diagrams including blocks representing the respective ones of the assembled components, and assembling the component fault-based models into the system fault-based model includes graphically expressing the system fault-based model as a block diagram including the blocks connected to one another, the block diagram being a reliability block diagram or functional flow block diagram.

3. The method of claim 2, wherein graphically expressing the system fault-based model includes graphically expressing the system fault-based model as the block diagram that is the reliability block diagram.

4. The method of claim 2, wherein graphically expressing the system fault-based model includes graphically expressing the system fault-based model as the block diagram that is the functional flow block diagram.

5. The method of claim 1, wherein receiving the component fault-based models includes receiving the component fault-based models from storage, the component fault-based models being stored in a library of component fault-based models.

6. The method of claim 1, wherein designing the complex system further comprises:
developing the component fault-based models of the components, including constructing the component fault-based models, and the transfer functions of the component fault-based models,
wherein the transfer function describes a logical relationship between the output and failure event of the respective component, and
wherein receiving the component fault-based models includes directly or indirectly receiving the component fault-based models so developed.

7. The method of claim 6, wherein the transfer function describes a logical relationship between the external input, command, output and failure event of the respective component, and
wherein assembling the component fault-based models includes connecting an output of a component fault-based model to an input of another component fault-based model, or to a Boolean logic operation that outputs to an input of another component fault-based model.

8. The method of claim 7, wherein connecting the output of the component fault-based model includes connecting the output of the component fault-based model to the input of another component fault-based model.

9. The method of claim 7, wherein connecting the output of the component fault-based model includes connecting the output of the component fault-based model to the Boolean logic operation that outputs to the input of another component fault-based model.

10. The method of claim 1, wherein performing the safety analysis includes performing a fault-tree analysis using the system fault-based model, and generating one or more minimal cut sets and probabilities for one or more failure conditions based thereon.

11. The method of claim 10, wherein generating the one or more minimal cut sets and probabilities for the one or more failure conditions includes generating a minimal cut set of the one or more minimal cut sets in which a Boolean expression for the failure event is reduced to a sum of products form.

12. The method of claim 10, wherein generating the one or more minimal cut sets and probabilities for the one or more failure conditions includes generating a probability of the probabilities in which directly by a truth-table or binary decision diagram technique, or indirectly from the one or more minimal cut sets using an inclusion-exclusion or sum-of-disjoint-products technique.

13. The method of claim 1, wherein designing and thereby producing the design of the complex system includes designing and thereby producing the design of the complex system embodied as an aircraft.

14. The method of claim 1, wherein a component fault-based model of the component fault-based models includes the external input or command to the respective component, a fault injection point at which the failure event is injected into the respective component, and outputs from the respective component in the failure mode and operating mode, and
wherein the component fault-based model further includes a transfer function of the transfer functions coupled to and describing one or more logical relationships between the external input or command, the fault injection point, and the outputs.

15. The method of claim 1, wherein a fault tree of the fault trees represents at least a partial success model in which a tuple including Boolean values of the failure event, the internal state or external input or command, and outputs in the failure mode and operating mode form a state vector.

16. The method of claim 1, wherein a fault tree of the fault trees describes output of the respective component in the failure mode of the respective component in response to the failure event, and describes output of the respective component in the operating mode of the respective component in response to the internal state of the respective component.

17. The method of claim 1, wherein a fault tree of the fault trees describes output of the respective component in the failure mode of the respective component in response to the failure event, and describes output of the respective component in the operating mode of the respective component in response to the external input to the respective component.

18. The method of claim 1, wherein a fault tree of the fault trees describes output of the respective component in the failure mode of the respective component in response to the failure event, and describes output of the respective component in the operating mode of the respective component in response to the command to the respective component.

19. The method of claim 1, wherein performing the safety analysis includes generating the fault propagation model based on at least some of the component fault-based models.

20. The method of claim 1, wherein performing the safety analysis includes generating the fault propagation model based on the system fault-based model.

\* \* \* \* \*